(12) United States Patent
Shoji

(10) Patent No.: US 7,554,325 B2
(45) Date of Patent: Jun. 30, 2009

(54) MAGNETIC SENSOR WITH NEEDLE-SHAPED DETECTING PART

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 281 days.

(21) Appl. No.: 11/737,412

(22) Filed: Apr. 19, 2007

(65) Prior Publication Data

US 2007/0252594 A1    Nov. 1, 2007

(30) Foreign Application Priority Data

Apr. 26, 2006    (JP)    ............... 2006-121782

(51) Int. Cl.
*G01N 27/74*    (2006.01)
*G01R 33/12*    (2006.01)
*G01R 33/02*    (2006.01)

(52) U.S. Cl. .................................. 324/252; 324/204
(58) Field of Classification Search .......... 324/204, 324/252

See application file for complete search history.

(56) References Cited

U.S. PATENT DOCUMENTS

| | | | |
|---|---|---|---|
| 4,556,925 A | * | 12/1985 | Suenaga et al. ............ 360/327 |
| 5,331,491 A | * | 7/1994 | Hayakawa et al. .......... 360/110 |
| 5,477,143 A | * | 12/1995 | Wu ........................ 324/207.21 |
| 5,982,177 A | * | 11/1999 | Cadieu .................... 324/252 |
| 7,106,051 B2 | | 9/2006 | Prins et al. |

FOREIGN PATENT DOCUMENTS

| | | |
|---|---|---|
| JP | 8-88423 | 4/1996 |
| JP | 8-138222 | 5/1996 |
| JP | 2001-336990 | 12/2001 |
| JP | 2002-55078 | 2/2002 |
| JP | 2003-204096 | 7/2003 |
| JP | 2005-85383 | 3/2005 |

* cited by examiner

*Primary Examiner*—Jay M Patidar
(74) *Attorney, Agent, or Firm*—Oblon, Spivak, McClelland, Maier & Neustadt, P.C.

(57) ABSTRACT

A magnetic sensor has a needle-shaped detecting part. The needle-shaped detecting part includes a substrate cut to have a needle shape, at least one MR element formed on the substrate, at least two lead conductors formed on the substrate, one end of the conductor being electrically connected to at least one MR element, and a protection film covering the at least one MR element and the at least two lead conductors.

20 Claims, 14 Drawing Sheets

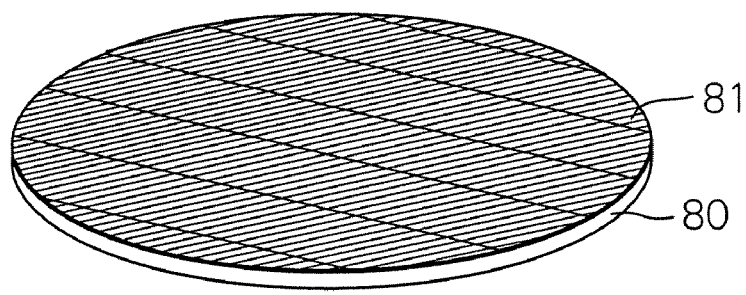
Fig. 8a
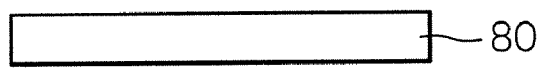
Fig. 8b
Fig. 8c
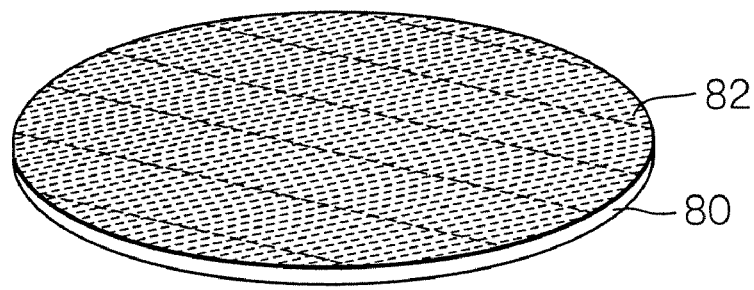
Fig. 9a
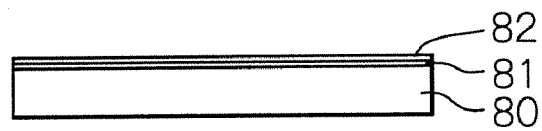
Fig. 9b
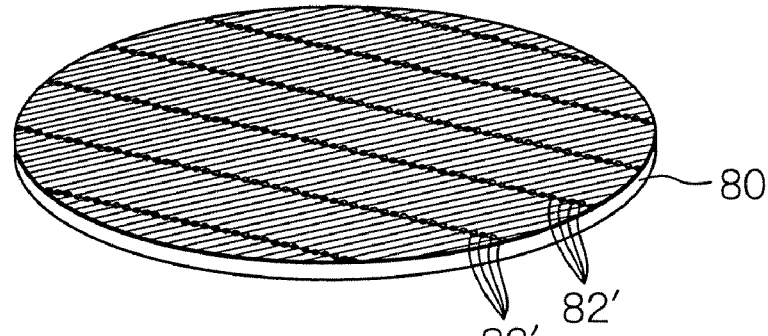
Fig. 10a
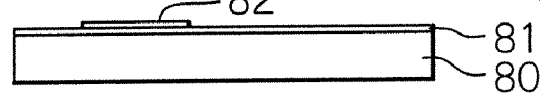
Fig. 10b

MAGNETIC SENSOR WITH NEEDLE-SHAPED DETECTING PART

PRIORITY CLAIM

This application claims priority from Japanese patent application No. 2006-121782, filed on Apr. 26, 2006, which is incorporated herein by reference.

BACKGROUND OF THE INVENTION

1. Field of the Invention

The present invention relates to a magnetic sensor with a needle-shaped detecting part for use in accurate measurement of presence probability (density) of magnetic substance in an infinite space, and a manufacturing method of a magnetic sensor.

2. Description of the Related Art

For measuring a density of magnetic particles in a fluid or for accurately measuring a concentration of magnetic fluid, a magnetic sensor, having a magnetoresistive effect (MR) element as an element for detecting magnetic field, has been used.

U.S. Pat. No. 7,106,051 B2 discloses an MR sensing device having a substrate with a layer structure for supporting a fluid, to measure a volume density of magnetic particles in the fluid. The layer structure has a first surface area in a first level, a second surface area in a second level different from the first level, and an MR element for detecting the magnetic field of at least one magnetic particle in the fluid. The MR element is positioned near a transition between the first and second surface areas, and faces at least one of the surface areas. U.S. Pat. No. 7,106,051 B2 also discloses that, in the MR sensing device, the fluid containing magnetic particles is supplied over the layer structure, output signal of the MR sensing element is detected while applying a magnetic field, and the output signal from the MR sensing element is compared with a reference signal obtained in the absence of the applied field to determine the volume density of magnetic particles.

Japanese Patent Publication No. 2002-055078A discloses a hypodermic needle-shaped active oxygen sensor with an oxygen reference substance. The oxygen reference substance is separated apart by a solid electrolyte and provided within a sharp tip pipe of the sensor.

Japanese Patent Publication No. 2001-336990A discloses a temperature-measurement apparatus including a needle-shaped sensor with a thermocouple temperature sensing element at its top end.

According to the magnetic sensor described in U.S. Pat. No. 7,106,051 B2, the magnetic field from magnetic particles can be measured with high sensitivity because an MR element is used. However, because the measurement of magnetic field is performed by fluid with a plate-shaped substrate with steps and therefore the shape of the substrate affects the measurement result, it is difficult to accurately measure the density of magnetic particles. That is, if there is a large body such as for example a plate-shaped substrate around a sensing element, because the substrate partially interrupts the magnetic field, an assumption that objects to be detected are uniform in all space does not stand and therefore the measured density is affected. For avoiding this influence, in U.S. Pat. No. 7,106,051 B2, the volume density of magnetic particles is obtained by comparing the output signal from the MR element while applying the magnetic field, to that obtained in the absence of an applied field.

In order to measure the density of magnetic particles accurately without performing such comparison measurement, it is important not only to make the whole magnetic sensor compact but also to reduce the influence from the material and shape of the other body supporting the magnetic detection element as far as possible.

As disclosed in Japanese Patent Publication Nos. 2002-055078A and 2001-336990A, if a detection element is attached to the probe of a fine needle, the sensor can be made compact, and influence from the shape of the substrate can be reduced a little. However, the sensor disclosed in Japanese Patent Publication No. 2002-055078A is an active oxygen sensor in which oxygen reference substance is provided separated apart by a solid electrolyte at its top end of the needle-shaped probe, and the sensor disclosed in Japanese Patent Publication No. 2001-336990A is a temperature sensor in which a thermocouple is provided at its top end of the needle-shaped probe. Namely, these sensors are not magnetic sensors for detecting the density of magnetic particles. Further, each of these needle-shaped probes has an outside diameter of about 0.7 mm at the minimum, and it was difficult in the prior art to achieve a finer probe even for an active oxygen sensor or a temperature sensor. Therefore, even if a magnetic sensor were implemented using a needle-shaped probe as described in Japanese Patent Publication No. 2002-055078A or 2001-336990A, some shape effect would occur because of the size, and it would be difficult to achieve highly accurate detection of the density.

SUMMARY OF THE INVENTION

It is therefore an object of the present invention to provide a miniaturized magnetic sensor capable of detecting a density of magnetic particles with high sensitivity and high accuracy without being affected by the shape of a probe, and to provide a manufacturing method of the magnetic sensor.

Another object of the present invention is to provide a manufacturing method of a magnetic sensor, whereby a magnetic sensor with a small size and high strength can be easily manufactured.

According to the present invention, a magnetic sensor has a needle-shaped detecting part. The needle-shaped detecting part includes a substrate cut to have a needle shape, at least one MR element formed on the substrate, at least two lead conductors formed on the substrate, one end of the conductor being electrically connected to at least one MR element, and a protection film covering the at least one MR element and the at least two lead conductors.

The substrate of the needle-shaped detecting part is machined to have a needle shape, and integrally includes thereon at least one MR element, at least two lead conductors, and a protection film covering these components, so that the needle-shaped detecting part can be a very fine needle of less than 150 μm (0.15 mm). Such a very fine needle-shaped detecting part allows highly accurate detection of the density of magnetic particles without being affected by the shape of a probe. Such a fine needle in general causes a lack of rigidity in the needle-shaped part, thereby sometimes resulting in easy bending and breakage. According to the invention, however, the substrate itself is cut into a needle shape, and therefore with use of hard material, such as AlTiC (sintered material of $Al_2O_3$—TiC), as the base material, a needle-shaped detecting part with high strength, hard to break and bend, can be obtained even for its fine needle shape. Term of "needle shape" generally means a thin and sharp-pointed shape, but it represents in this specification an extremely thin or fine shape having, for example, a length larger than ten times the diameter. It is preferable for the top end to be a sharp edge, but a blunt edge, a rounded edge or other shape is also acceptable if that part is extremely fine.

It is preferred that at least one MR element includes at least one MR element formed at a top portion of the substrate. Here, the "top portion of the substrate" indicates a portion ranging from the top end to ⅓ of the full length of the substrate, for example.

It is also preferred that at least one MR element further includes at least one MR element formed at a base portion of the substrate. Here, the "base portion of the substrate" indicates a portion ranging from the rear end to ⅓ of the full length of the substrate, for example.

It is further preferred that at least one MR element further includes at least one MR element formed at a middle portion of the substrate. Here, the "middle portion of the substrate" indicates a portion of the substrate except the top portion and the base portion.

It is still further preferred that at least one MR element includes one MR element for measurement formed at the top portion of the substrate, and three MR elements formed at the base portion of the substrate. In this case, preferably, four MR elements constitute a bridge connection.

It is preferred that at least one MR element includes one MR element for measurement formed at the top portion of the substrate, at least one MR element for measurement formed at the middle portion of the substrate, and at least four MR elements formed at the base portion of the substrate. In this case, preferably, one MR element for measurement formed at the top portion of the substrate and three of the at least four MR elements formed at the base portion of the substrate constitute a bridge connection, and one of the at least one MR element for measurement formed at the middle portion of the substrate and three of the at least four MR elements formed at the base portion of the substrate constitute a bridge connection.

It is also preferred that at least one MR element includes a plurality of MR elements having the same fixed magnetization direction.

It is further preferred that the substrate is made of metal material or ceramic material. In this case, preferably, the metal material is stainless steel, and the ceramic material is AlTiC.

It is still further preferred that a top end of the substrate has a sharp edge with a slope surface. In this case, preferably, the slope surface of the sharp edge of the substrate is inclined at angles of 10-45 degrees to a longitudinal direction of the substrate.

It is further preferred that the protection film is a ceramic layer. Preferably, the ceramic layer is an alumina ($Al_2O_3$) layer.

It is also preferred that the magnetic sensor further includes a surface modifying layer covering almost whole surface of it (except the portion of connection pads). In this case, preferably, the surface modifying layer is a diamond-like carbon (DLC) layer, a titanium nitride (TiN) layer, or a titanium oxide ($TiO_2$) layer.

It is further preferred that at least one MR element is at least one giant magnetoresistive effect (GMR) element or tunnel magnetoresistive effect (TMR) element.

It is still further preferred that the magnetic sensor further includes at least two connection pads formed on the substrate and electrically connected, respectively, to the other ends of at least two lead conductors.

It is further preferred that the magnetic sensor further includes a flexible wiring member, one end of the flexible wiring member being electrically connected to at least two connection pads. Preferably, the flexible wiring member is a flexible printed circuit (FPC) member.

It is further preferred that the magnetic sensor further includes a housing for tightly sealing and incorporating the base portion of the needle-shaped detecting part and the flexible wiring member. In this case, preferably, the housing is formed of resin material.

According to the invention, a manufacturing method of a magnetic sensor includes a wafer process, and a machining process. The wafer process forms on a wafer a number of MR elements, a number of lead conductors and a number of connection pads using thin-film photolithography technology. One ends of the lead conductors are electrically connected to the MR elements, respectively, the other ends of the lead conductors are electrically connected to the connection pads, respectively. The machining process produces needle-shaped detecting parts by cutting the wafer after the wafer process. Each needle-shaped detecting part includes a needle-shaped substrate, at least one MR element formed on the substrate, at least two lead conductors formed on the substrate, and at least two connection pads. One end of the lead conductor is electrically connected to the at least one MR element, at least two connection pads are formed on the substrate and electrically connected, respectively, to the other ends of the at least two lead conductors.

A needle-shaped substrate having a sharp edge is obtained by cutting the wafer. The substrate includes at least one MR element, at least two lead conductors and at least two connection pads, which are integrally formed on the substrate. This process allows the needle-shaped detecting part to be a very fine needle of less than 150 μm. Such a very fine needle-shaped detecting part allows highly accurate detection of the density of magnetic particles without being affected by the shape of a probe. Such a fine needle in general causes a lack of rigidity in the needle-shaped part, thereby sometimes resulting in easy bending and breakage. According to the invention, however, the substrate itself is cut into a needle shape, and therefore with use of hard material, such as AlTiC, as the base material, a needle-shaped detecting part with high strength, hard to break and bend, can be obtained even for its fine needle shape. Additionally, such a needle-shaped detecting part is formed by the thin-film wafer process and the machining process, so that a magnetic sensor can be manufactured very easily.

It is preferred that the wafer process includes a process for covering with a protection film the at least one MR element and the at least two lead conductors.

It is also preferred that the process for covering with a protection film includes a process for covering with a ceramic layer the at least one MR element and the at least two lead conductors. Preferably, the ceramic layer is an $Al_2O_3$ layer.

It is further preferred that the machining process includes a process for cutting the wafer into bar members, each bar member having a plurality of needle-shaped detecting parts arranged in a line, a process for sharpening one end of the bar member to have a sharp edge with a slope surface, and a process for cutting the bar member to separate into individual needle-shaped detecting parts. In this case, preferably, the sharpening process is a process for making a slope surface at the top end of the needle-shaped detecting part at angles of 10-45 degrees to a longitudinal direction of the needle-shaped detecting part.

It is still further preferred that the method further includes a process for covering with a surface modifying layer almost whole surface of the needle-shaped detecting part. In this case, preferably, the surface modifying layer is a DLC layer, a TiN layer or a $TiO_2$ layer.

It is preferred that the method further includes a connecting process for electrically connecting one end of a flexible wiring member to the at least two connection pads of the needle-shaped detecting part.

It is also preferred that the method further includes an incorporating process for tightly sealing and incorporating in a housing a base portion of the needle-shaped detecting part and the flexible wiring member.

It is further preferred that the wafer process includes a process for forming at least one MR element at the top portion of the substrate.

It is still further preferred that the wafer process includes a process for forming at least one MR element also at the middle portion of the substrate.

It is further preferred that the wafer process includes a process for forming at least one MR element also at the base portion of the substrate.

It is further preferred that the wafer process includes a process for magnetizing the MR elements so that fixed magnetization directions are directed to one same direction.

It is still further preferred that the wafer is made of metal material or ceramic material. In this case, preferably, the metal material is stainless steel, and the ceramic material is AlTiC.

It is further preferred that the wafer process is a process for forming at least one GMR element or TMR element as at least one MR element.

Further objects and advantages of the present invention will be apparent from the following description of the preferred embodiments of the invention as illustrated in the accompanying drawings.

BRIEF DESCRIPTION OF THE DRAWINGS

FIGS. 8a to 8c are views illustrating a part of a manufacturing process of the magnetic sensor shown in FIG. 1;

FIGS. 9a and 9b are views illustrating a part of the manufacturing process of the magnetic sensor shown in FIG. 1;

FIGS. 10a and 10b are views illustrating a part of the manufacturing process of the magnetic sensor shown in FIG. 1;

DESCRIPTION OF THE PREFERRED EMBODIMENTS

Figure 1:
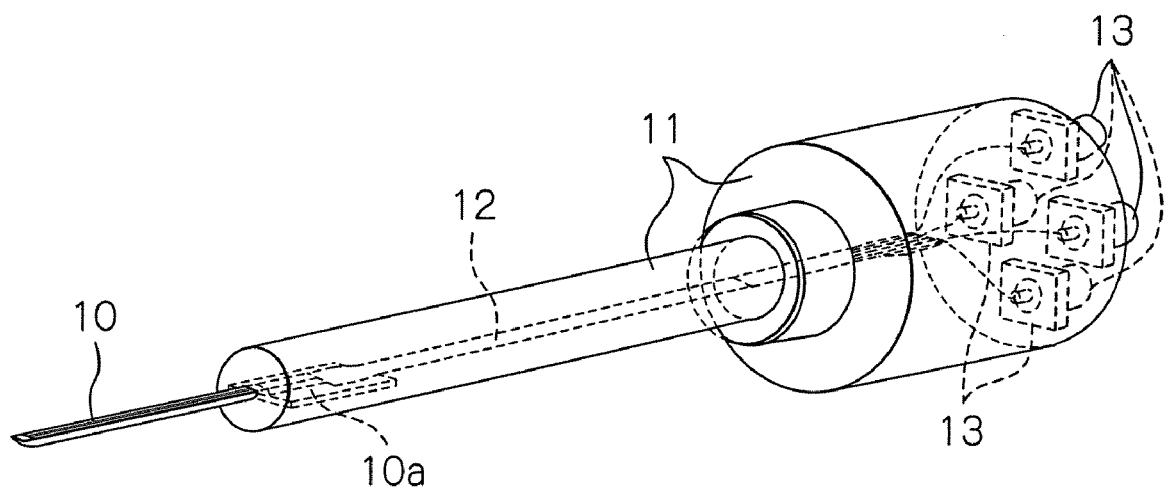
FIG. 1 is a perspective view schematically illustrating the whole structure of a magnetic sensor as a preferred embodiment according to the present invention.

FIG. 1 schematically illustrates the whole structure of a magnetic sensor as a preferred embodiment according to the present invention.

In the figure, reference numeral 10 denotes a solid (not hollowed) needle-shaped detecting part having a sharp top end, 11 denotes a housing accommodating therein a base portion 10a of the needle-shaped detecting part 10 and an FPC member 12 as a wiring member, and 13 denotes connectors connected to a detection circuit (not shown), respectively.

The housing 11 is a mold of resin material tightly sealing and incorporating the base portion 10a of the needle-shaped detecting part 10, the whole of FPC member 12, a part of connectors 13, and the like. For the resin material, any generally used resin material may be used, and there is used in the embodiment polyethylene telephthalate (PET) composite resin, for example, UNILATE™ of UNITIKA Ltd. Incidentally, the housing 11 may be made of any materials other than resin, if it is non-magnetic material that does not affect the magnetic field applied from the outside.

Figure 2:
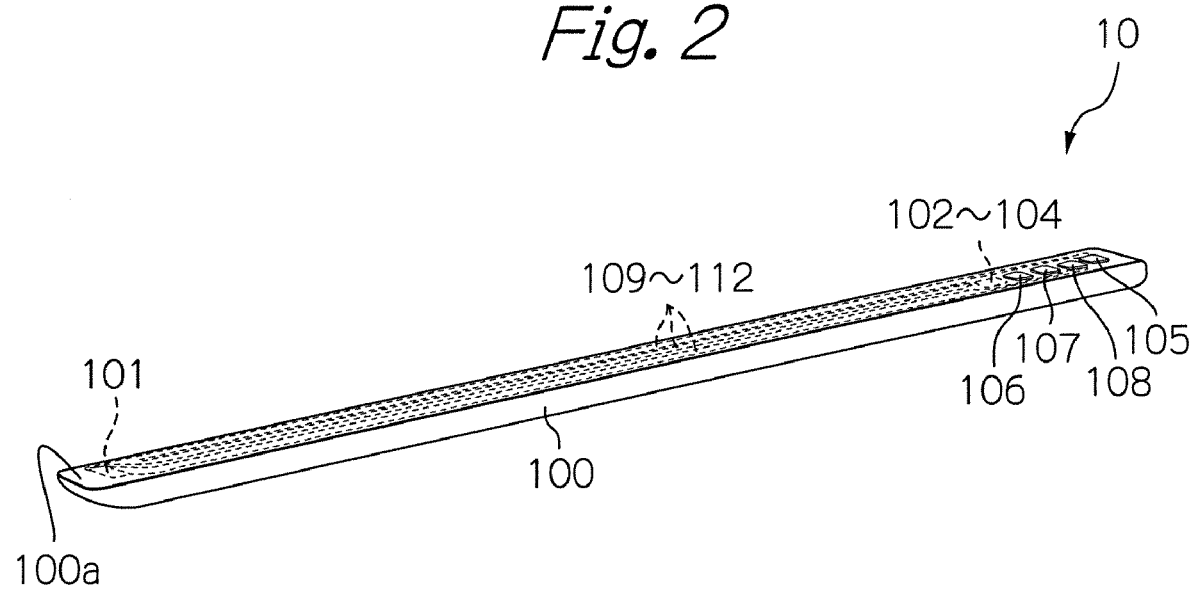
FIG. 2 is a perspective view schematically illustrating the structure of a needle-shaped detecting part of the magnetic sensor shown in FIG. 1.
Figure 3:
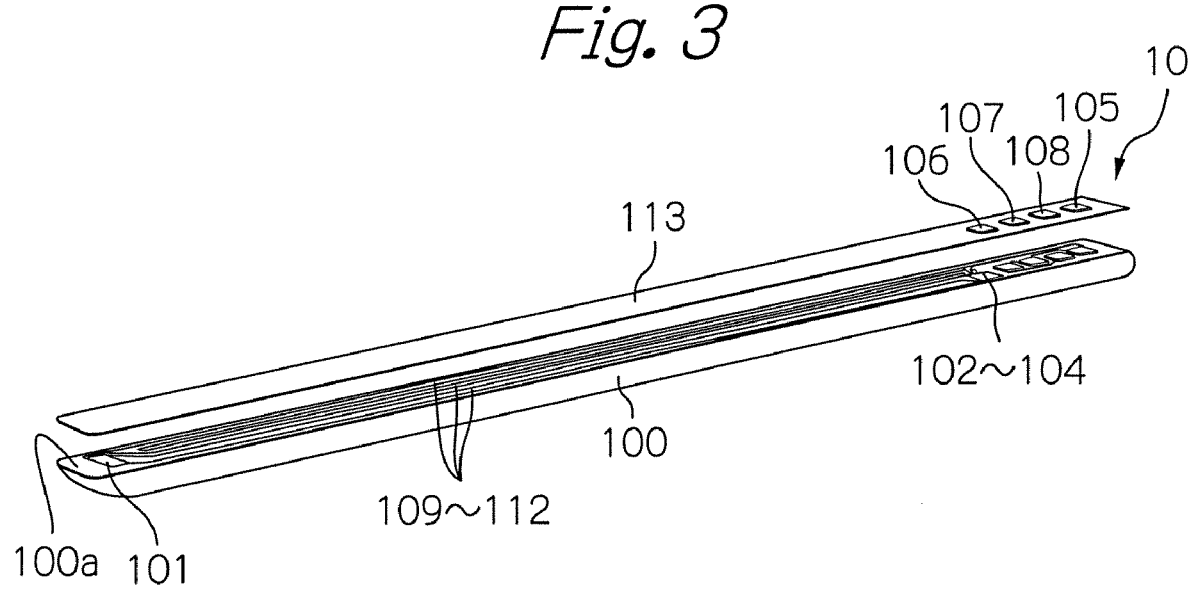
FIG. 3 is an exploded perspective view schematically illustrating the structure of the needle-shaped detecting part of the magnetic sensor shown in FIG. 1.
Figure 4:
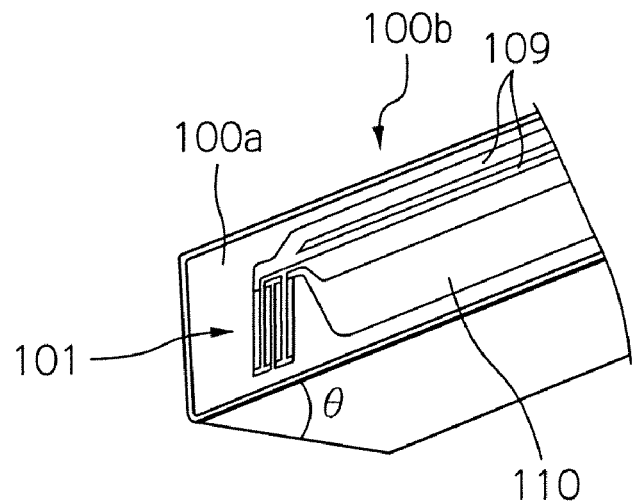
FIG. 4 is an enlarged perspective view schematically illustrating the structure of the top portion of the needle-shaped detecting part of the magnetic sensor shown in FIG. 1.
Figure 5:
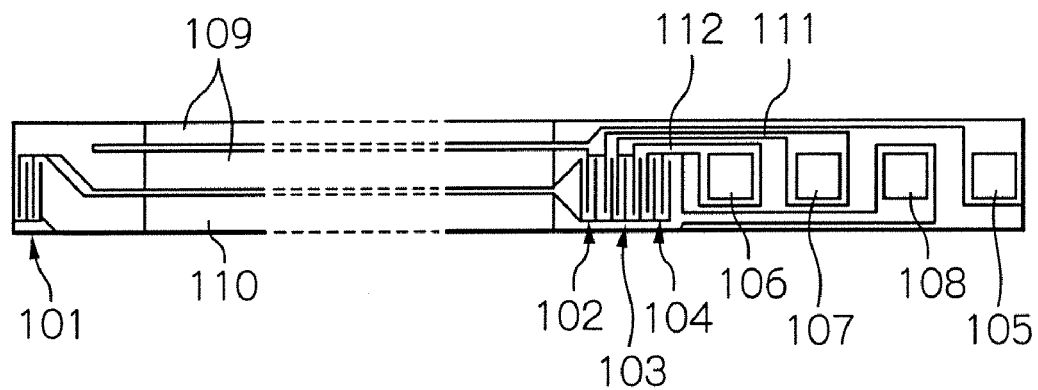
FIG. 5 is a plan view schematically illustrating a pattern of GMR elements, lead conductors and connection pads in the needle-shaped detecting part of the magnetic sensor shown in FIG. 1.
Figure 6:
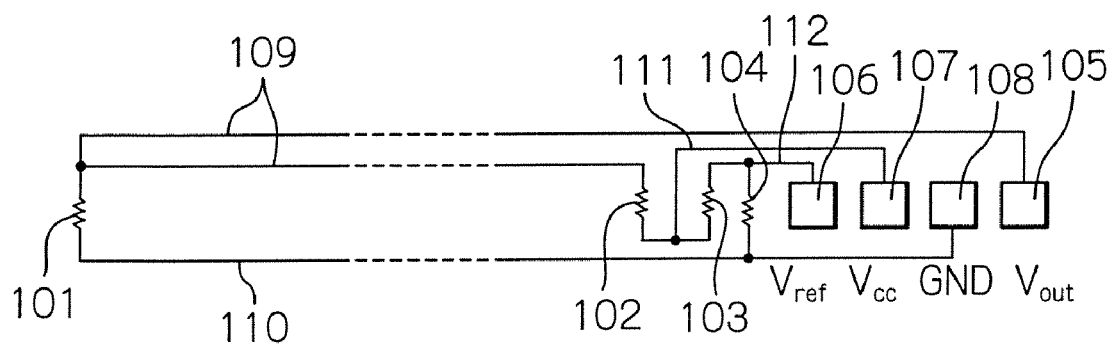
FIG. 6 is a circuit diagram illustrating an electric configuration of the GMR elements, lead conductors and connection pads in the needle-shaped detecting part of the magnetic sensor shown in FIG. 1.
Figure 7:
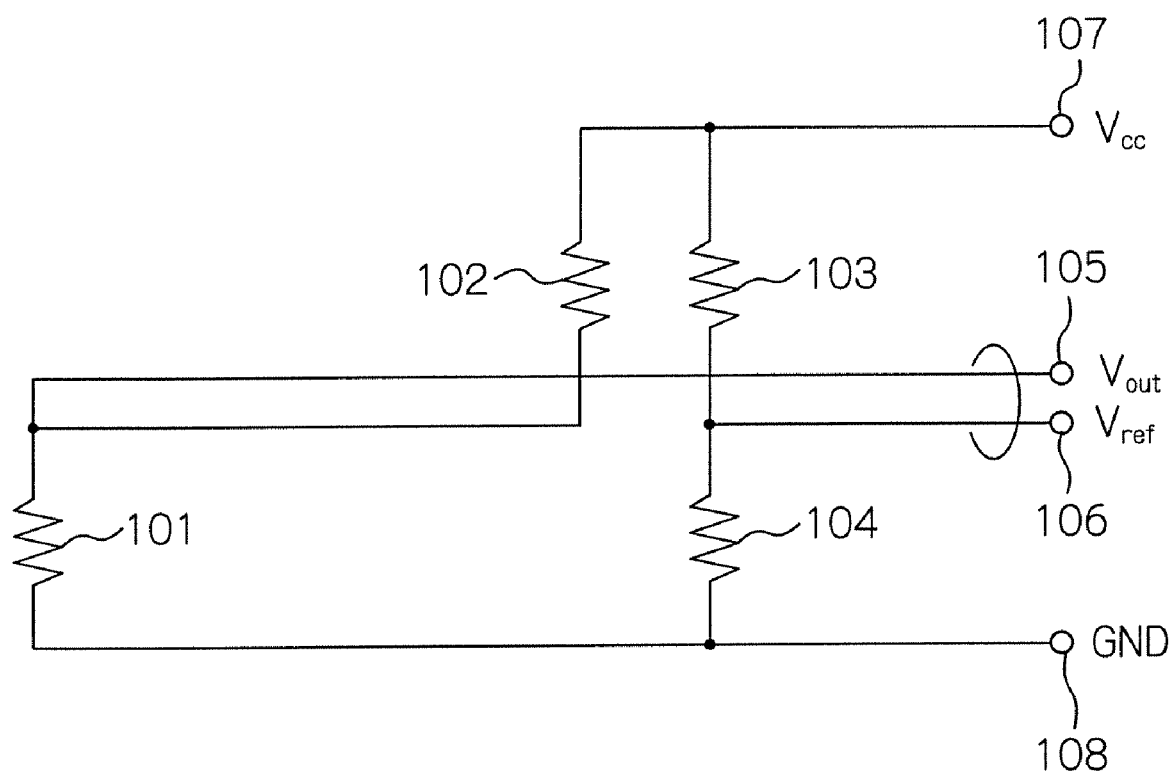
FIG. 7 is a circuit diagram illustrating the electric configuration of the GMR elements, lead conductors and connection pads in the needle-shaped detecting part of the magnetic sensor shown in FIG. 1.

FIG. 2 schematically illustrates the structure of the needle-shaped detecting part of the magnetic sensor shown in FIG. 1, FIG. 3 schematically illustrates the structure of the needle-shaped detecting part of the magnetic sensor shown in FIG. 1, FIG. 4 schematically illustrates the structure of the top portion of the needle-shaped detecting part of the magnetic sensor shown in FIG. 1, FIG. 5 schematically illustrates GMR elements and a pattern, including lead conductors and connection pads in the needle-shaped detecting part of the magnetic sensor shown in FIG. 1, and FIGS. 6 and 7 illustrate an electric configuration for the GMR elements, lead conductors and connection pads in the needle-shaped detecting part of the magnetic sensor shown in FIG. 1.

As shown in these figures, the needle-shaped detecting part 10 consists of a substrate 100 to which a cutting process is applied to have a needle shape with a sharp edge, four spin-valve GMR elements 101, 102, 103 and 104 formed of thin films on one surface or element-formed surface 100a of the substrate 100, four connection pads 105, 106, 107 and 108, lead conductors 109, 110, 111 and 112 for electrically connecting the spin-valve GMR elements 101, 102, 103 and 104 to the connection pads 105, 106, 107 and 108, and a protection film 113 for covering the spin-valve GMR elements 101, 102, 103 and 104 and the lead conductors 109, 110, 111 and 112 except parts of the connection pads 105, 106, 107 and 108.

The substrate 100 is made of hard material including metal material such as stainless steel, or ceramic material such as AlTiC ($Al_2O_3$—TiC).

Each of the spin-valve GMR elements 101, 102, 103 and 104 has a multi-layered structure formed basically by stacking a magnetization fixed layer consisting of a pin layer of anti-ferromagnetic material and a pinned layer of ferromagnetic material, a nonmagnetic space layer and a magnetization free layer (free layer) of ferromagnetic material. Magnetization of the pinned layer is fixed to a direction perpendicular to an extending direction of the free layer. All spin-valve GMR elements 101, 102, 103 and 104 have the same fixed magnetization direction. In this embodiment, as shown in FIG. 5, each spin-valve GMR element is configured such that four spin-valve GMR multi-layered films are arranged in parallel with each other and connected in series with lead conductors. In a modification, each spin-valve GMR element may be configured by a single strip spin-valve GMR multi-layered film with a folded-back pattern.

The connection pads 105, 106, 107 and 108 and the lead conductors 109, 110, 111 and 112 are made of conductive material such as copper (Cu). These connection pads 105, 106, 107 and 108 are formed by a bump layer of Cu and a bonding pad layer of gold (Au) laid on the bump layer.

The protection film 113 consists of a single ceramic layer, such as an $Al_2O_3$ layer, in this embodiment. The whole surface of the needle-shaped detecting part 10 except the portion of the connection pads 105, 106, 107 and 108 is coved with a surface modifying layer, such as a DLC layer, a TiN layer or a $TiO_2$ layer. When the DLC layer is used as the surface modifying layer, it is beneficial to measurement, inspection or the like in a medical field because DLC has high biocompatibility. Since the TiN layer is a hard layer, it can harden the surface. The $TiO_2$ layer can have a function of decomposing contamination with the photo-catalyst reaction.

The connection pad 105 is provided for an output voltage Vout, the pad 106 for a reference voltage Vref, the pad 107 for a power supply voltage Vcc, and the pad 108 for a ground GND. The lead conductor 109 electrically connects the Vout connection pad 105 to one ends of the spin-valve GMR elements 101 and 102, the lead conductor 110 connects the GND pad 108 to the other end of the GMR element 101 and one end of the spin-valve GMR element 104, the lead conductor 111 connects the Vcc pad 107 to the other end of the GMR element 102 and one end of the spin-valve GMR element 103, and the lead conductor 112 connects the Vref pad 106 to the other ends of the GMR elements 103 and 104. As understood from FIG. 7, the four spin-valve GMR elements 101, 102, 103 and 104 constitute a Wheatstone bridge connection. The GMR element 101 operates as an element for magnetic detection (for measurement), and the other GMR elements 102, 103 and 104 operate as elements for temperature compensation.

In this embodiment, the top end of the substrate 100 is cut off slantwise at the side opposite to the element-formed surface 10a, that is, a sharpening process is applied to have a sharp edge. The top end of the substrate 100 has an inclination angle θ of 10-45 degrees to a longitudinal direction. This range of angles allows fabricating with a high process yield magnetic sensors that can detect a density of magnetic particles without the shape effect of the probe.

The spin-valve GMR element 101 for measurement is formed at the top portion of the substrate 100, and the GMR elements 102 to 104 for temperature compensation are formed at the base portion of the substrate 100.

The magnetic sensor of this embodiment is very effective for measuring a density of magnetic particles in a fluid or a concentration of a magnetic fluid. For example, the sensor is quite effective for measuring a density of fine ferrite or metal particles used in heat treatment of an animal specimen or the like.

Measurement of the density of magnetic particles is performed by detecting with a magnetic sensor the magnetic field emitted from a fluid containing magnetic particles while a uniform external magnetic field is applied. The magnetic field inside a spherical magnetic substance placed in a uniform magnetic field is also uniform, and the magnetic field is represented by the applied magnetic field and the magnetic permeability of the magnetic substance. There is a certain relationship between a relative permeability and a volume density of the magnetic substance. Therefore, if the detected magnetic field and the applied field are given, then the density of magnetic particles, proportional to the field, can be obtained. Here, it is assumed that fine magnetic particles have uniform shapes and are distributed uniformly, and also the magnetic fluid distributes in spherical. In actual measurement of the density, the needle-shaped detecting part 10 of the magnetic sensor is inserted into a fluid to be measured, and an output voltage Vout is extracted. More concretely, for example, a differential voltage between the output voltage Vout and the reference voltage Vref is extracted.

As described above, according to the magnetic sensor of this embodiment, because the substrate 100 itself is a needle-shaped solid body having a sharp top end with application of sharpening cut and spin-valve GMR elements are integrally formed thereon, the needle-shaped detecting part 10 can be formed as a very fine needle of less than 150 µm. Such a very fine needle-shaped detecting part allows highly accurate detection of the density without being affected by the shape of a probe by penetrating it into an arbitrary portion of a measurement object or specimen. Further, since the substrate 100 is formed of hard material such as AlTiC, the needle-shaped detecting part 10 is hard to break and bend, having high strength even for its fine needle shape. Still further, the detecting part 10 is covered by the inorganic protection film 113 containing a ceramic layer such as an $Al_2O_3$ layer, and therefore it can be used for any specimen safely and reliably. Additionally, this magnetic sensor does not use substance having bad influence on the environment, therefore it is disposable. Also, using of the spin-valve GMR elements as detecting elements allows the sensor to be miniaturized and to detect the density with very high sensitivity.

Hereinbefore is described for a case using the DC power supply, but an AC power supply may be apparently used for AC driving.

Instead of using spin-valve GMR elements as the magnetic detecting elements, TMR elements may be apparently used.

FIGS. 8a to 29b illustrate manufacturing processes of the magnetic sensor in this embodiment. Hereinafter, a manufacturing method of the magnetic sensor will be explained with reference to these drawings.

First, as shown in FIGS. 8a and 8c, an under layer 81 made of aluminum oxide ($Al_2O_3$) is formed on an AlTiC ($Al_2O_3$—TiC) wafer or substrate 80 shown in FIG. 8b.

Then, as shown in FIGS. 9a and 9b, a multi-layered film 82 for spin-valve GMR elements is formed on the under layer 81.

Next, as shown in FIGS. 10a and 10b, the multi-layered film 82 is patterned to obtain a number of spin-valve GMR elements 82'.

Figure 11A:
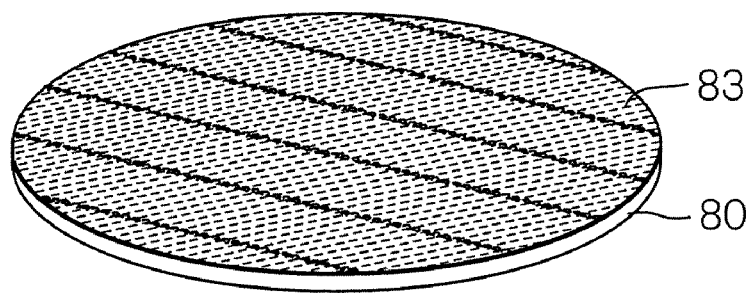
FIGS. 11a and 11b are views illustrating a part of the manufacturing process of the magnetic sensor shown in FIG. 1.
Figure 11B:
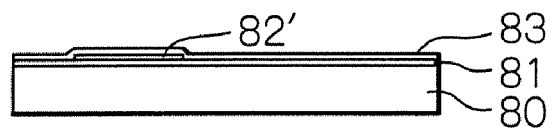

Then, as shown in FIGS. 11a and 11b, a protection layer 83 made of for example $Al_2O_3$ is formed to cover the spin-valve GMR elements 82'.

Figure 12A:
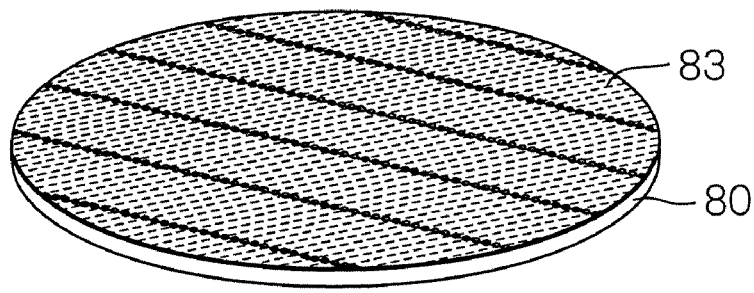
FIGS. 12a and 12b are views illustrating a part of the manufacturing process of the magnetic sensor shown in FIG. 1.
Figure 12B:
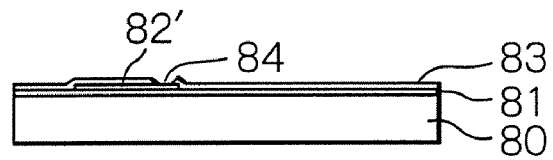

Next, as shown in FIGS. 12a and 12b, through-holes 84 are formed in the protection layer 83 at positions corresponding to both ends of the spin-valve GMR elements 82'.

Figure 13A:
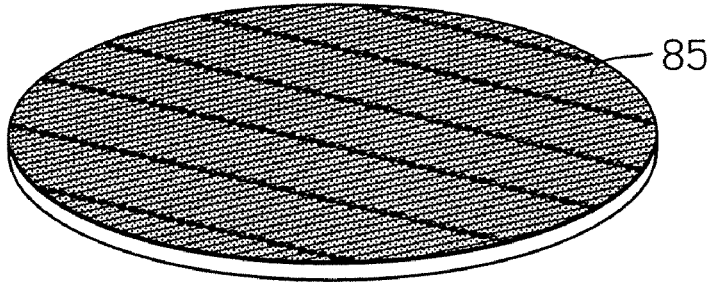
FIGS. 13a and 13b are views illustrating a part of the manufacturing process of the magnetic sensor shown in FIG. 1.
Figure 13B:
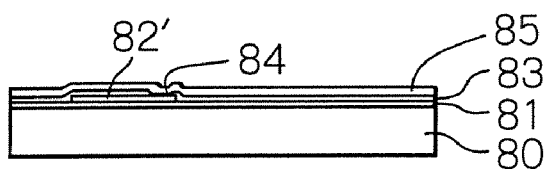

Next, as shown in FIGS. 13a and 13b, a conductive material layer 85 made of for example copper (Cu) is formed thereon.

Figure 14A:
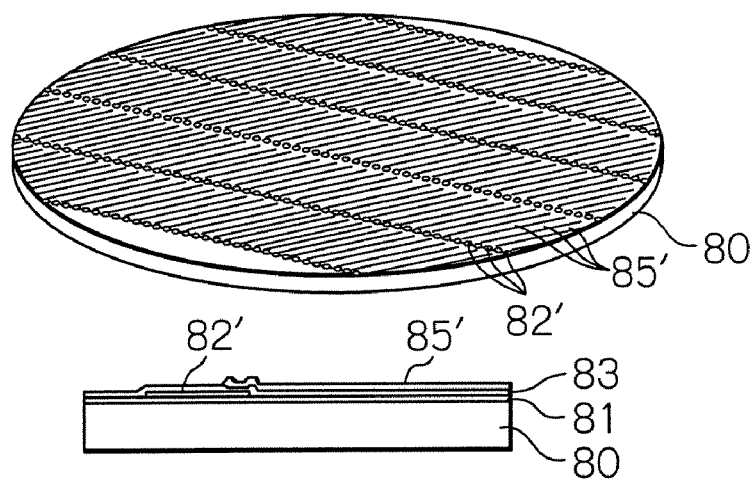
FIGS. 14a and 14b are views illustrating a part of the manufacturing process of the magnetic sensor shown in FIG. 1.
Figure 14B:
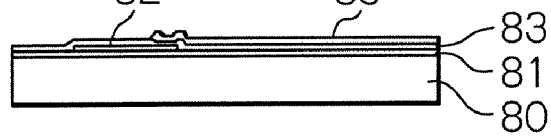

Then, as shown in FIGS. 14a and 14b, the conductive material layer 85 is patterned to form lead conductors 85', one ends of the conductors 85' being electrically connected to the spin-valve GMR elements 82', respectively.

Figure 15A:
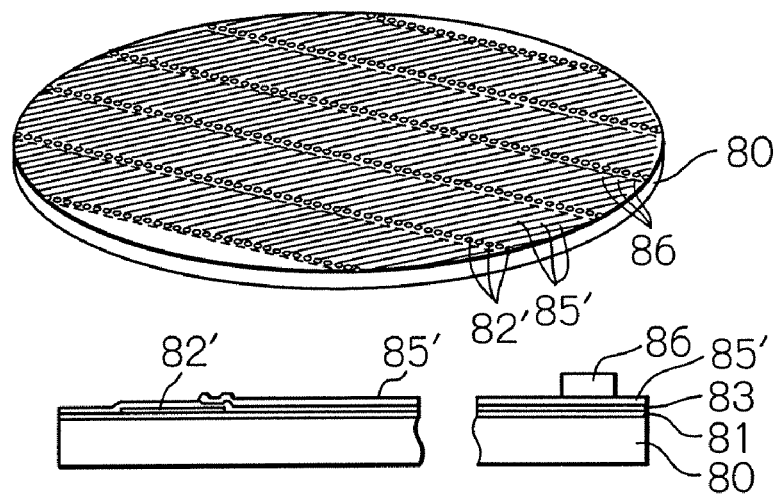
FIGS. 15a and 15b are views illustrating a part of the manufacturing process of the magnetic sensor shown in FIG. 1.
Figure 15B:

Subsequently, as shown in FIGS. 15a and 15b, bumps 86 made of conductive material such as Cu are formed on the other end portions of the lead conductors 85'.

Figure 16A:
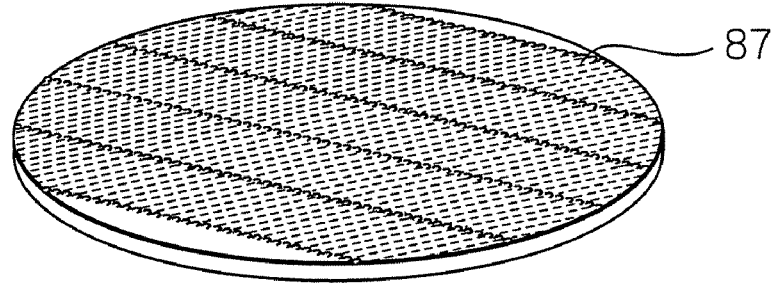
FIGS. 16a and 16b are views illustrating a part of the manufacturing process of the magnetic sensor shown in FIG. 1.
Figure 16B:
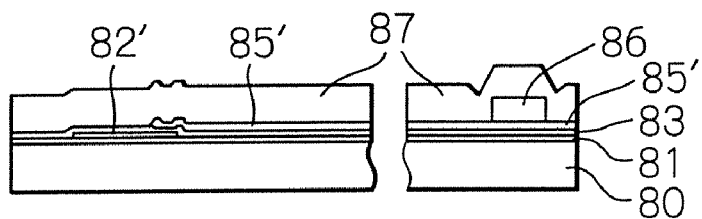

Then, as shown in FIGS. 16a and 16b, a protection film 87 made of for example $Al_2O_3$ is formed thereon. This film may be made of other ceramic material than $Al_2O_3$.

Figure 17A:
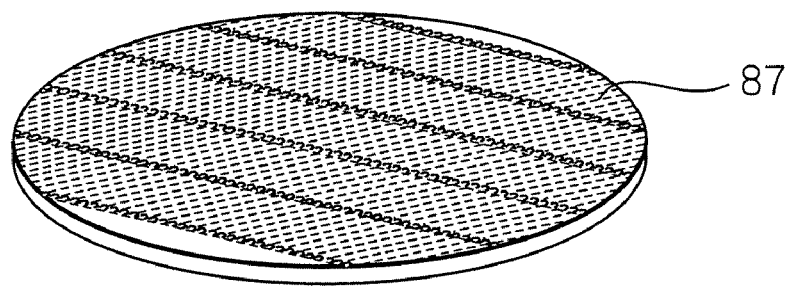
FIGS. 17a and 17b are views illustrating a part of the manufacturing process of the magnetic sensor shown in FIG. 1.
Figure 17B:
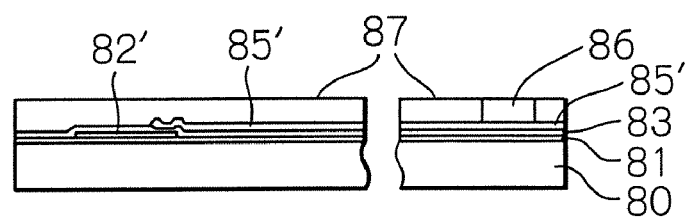

Then, as shown in FIGS. 17a and 17b, the surface of the protection film 87 and the bumps 86 is lapped and flattened to expose the bumps 86.

Figure 18A:
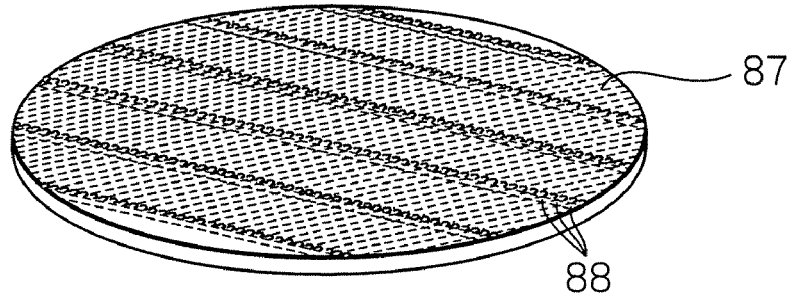
FIGS. 18a and 18b are views illustrating a part of the manufacturing process of the magnetic sensor shown in FIG. 1.
Figure 18B:
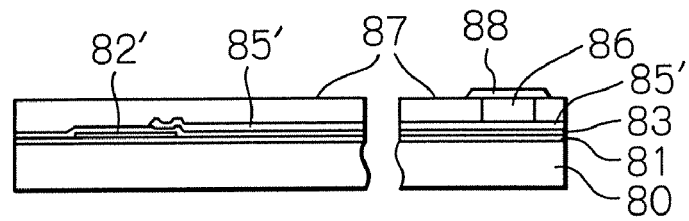

Next, as shown in FIGS. 18a and 18b, a bonding pad layer 88 made of for example gold (Au) is formed on the bumps 86.

Figure 19:
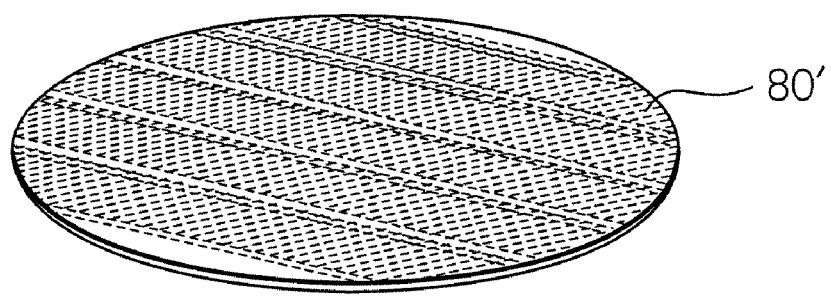
FIG. 19 is a view illustrating a part of the manufacturing process of the magnetic sensor shown in FIG. 1.

Thereafter, as shown in FIG. 19, the back surface of the wafer 80, on the front surface thereof a number of spin-valve GMR elements, lead conductors and connection pads being formed, is ground to obtain a thinned wafer 80' having a thickness of 250-300 µm.

Figure 20:
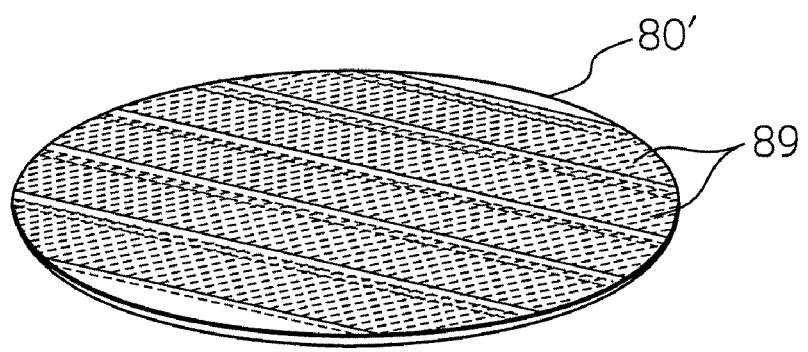
FIG. 20 is a view illustrating a part of the manufacturing process of the magnetic sensor shown in FIG. 1.
Figure 21:
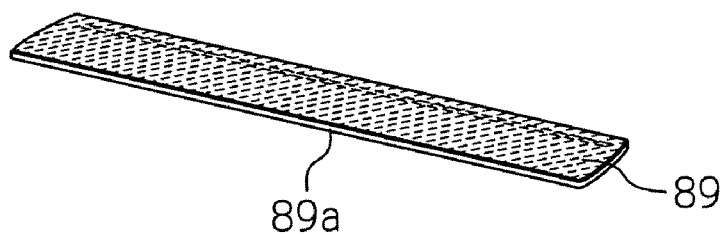
FIG. 21 is a view illustrating a part of the manufacturing process of the magnetic sensor shown in FIG. 1.

Then, as shown in FIG. 20, the thinned wafer 80' is cut into a plurality of bar members 89, each having a plurality of needle-shaped detecting parts arranged in a line thereon. FIG. 21 shows one of the bar members 89 thus obtained.

Figure 22:
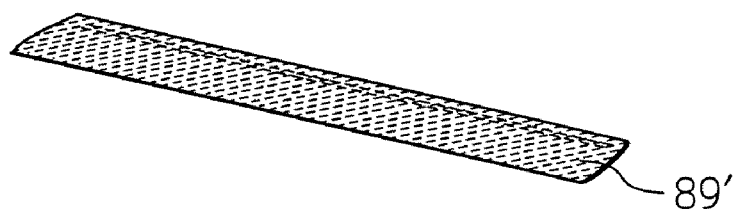
FIG. 22 is a view illustrating a part of the manufacturing process of the magnetic sensor shown in FIG. 1.

Next, one end 89a of the bar member 89 that corresponds to the top end of the needle-shaped detecting part is machined to have a sharp edge with a slope surface to obtain a bar member 89' shown in FIG. 22. This machining is to make a sharp edge with a slope surface inclined at angles of 10-45 degrees to the longitudinal direction at the top end of each needle-shaped detecting part when it is separated from the bar member.

Figure 23:
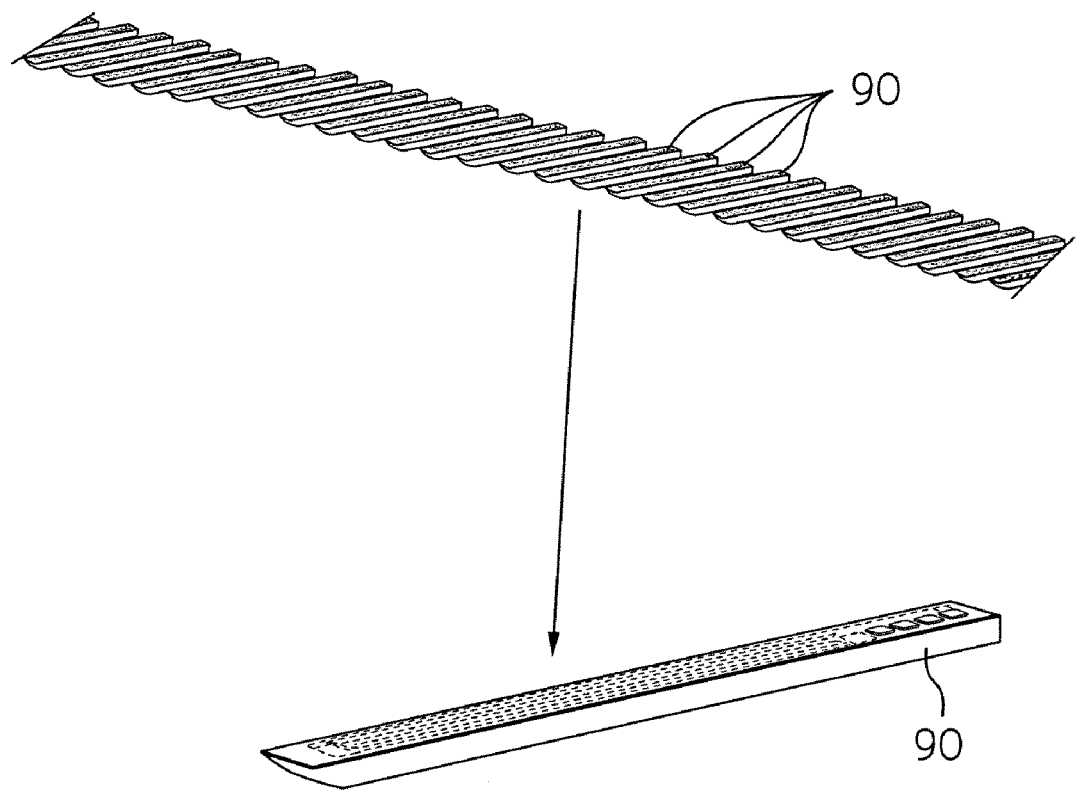
FIG. 23 is a view illustrating a part of the manufacturing process of the magnetic sensor shown in FIG. 1.

Then, as shown in FIG. 23, the sharpening cut-applied bar member 89' is cut and separated into individual needle-shaped detecting part 90.

Figure 24:
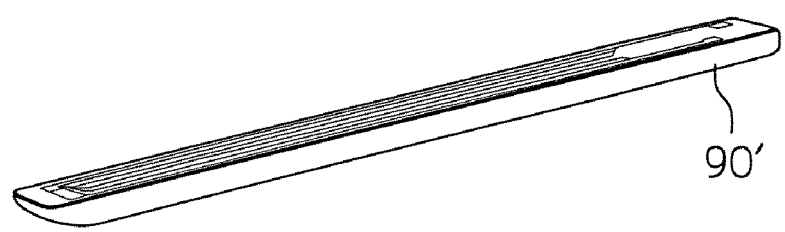
FIG. 24 is a view illustrating a part of the manufacturing process of the magnetic sensor shown in FIG. 1.

Next, as shown in FIG. 24, the detecting part 90 is chamfered along the longitudinal direction, as needed, to obtain a needle-shaped detecting part 90'. Then, the whole surface of the needle-shaped detecting part 10, except the portions of the connection pads 105, 106, 107 and 108, is coved with a surface modifying layer, such as a diamond-like carbon (DLC) layer, a titanium nitride (TiN) layer, or a titanium oxide ($TiO_2$) layer.

Figure 25:
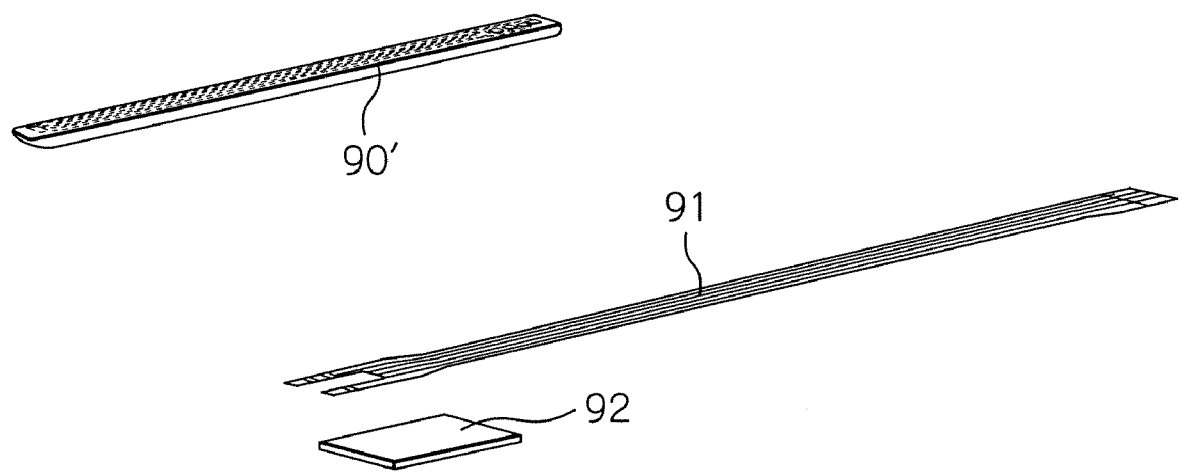
FIG. 25 is a view illustrating a part of the manufacturing process of the magnetic sensor shown in FIG. 1.

Thereafter, assembling of the magnetic sensor is performed. As shown in FIG. 25, a chamfered needle-shaped detecting part 90', an FPC member 91 as a wiring member, and a base plate 92 made of a hard plate such as for example a stainless steel plate are prepared.

Figure 26:
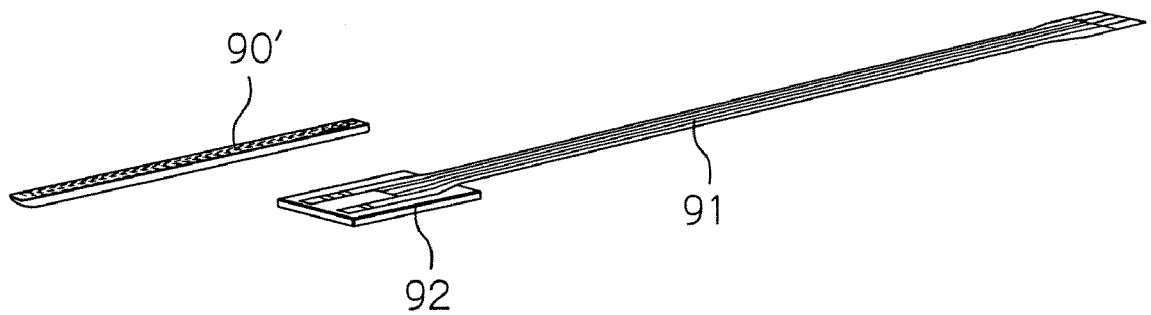
FIG. 26 is a view illustrating a part of the manufacturing process of the magnetic sensor shown in FIG. 1.
Figure 27:
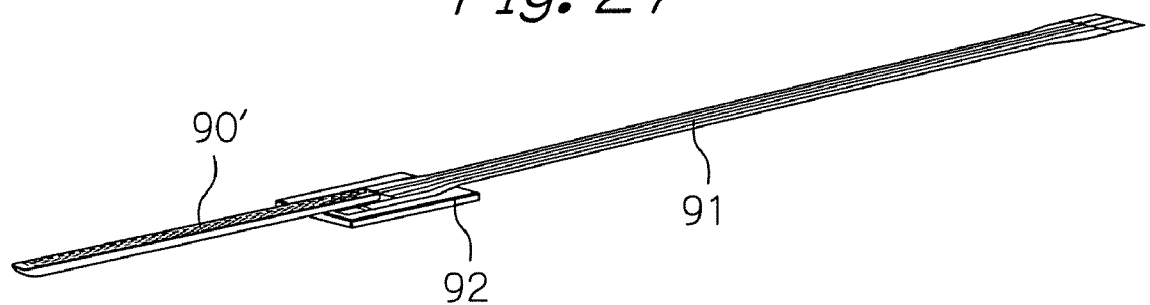
FIG. 27 is a view illustrating a part of the manufacturing process of the magnetic sensor shown in FIG. 1.

Then, as shown in FIG. 26, the FPC member 91 is adhered and fixed to the base plate 92, and also the rear end portion that is the connection-pad side of the detecting part 90' is adhered and fixed to the base plate 92 as shown in FIG. 27.

Figure 28:
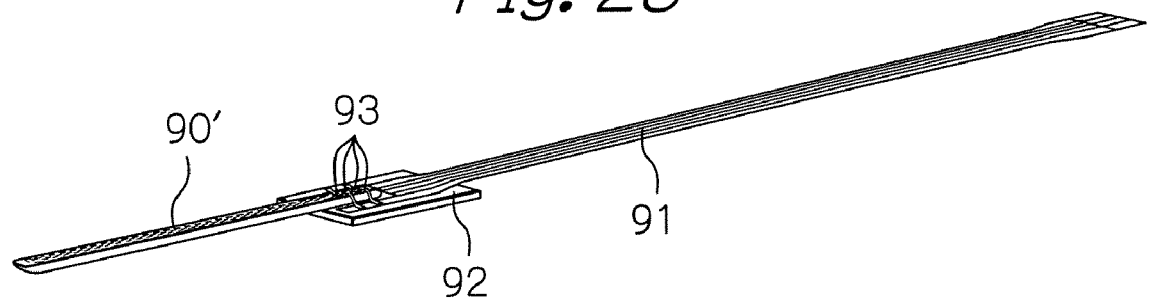
FIG. 28 is a view illustrating a part of the manufacturing process of the magnetic sensor shown in FIG. 1.

Then, as shown in FIG. 28, four connection pads of the needle-shaped detecting part 90' are wire-bonded to respective connection pads of the FPC member using wires 93 to electrically connect to each other.

Figure 29:
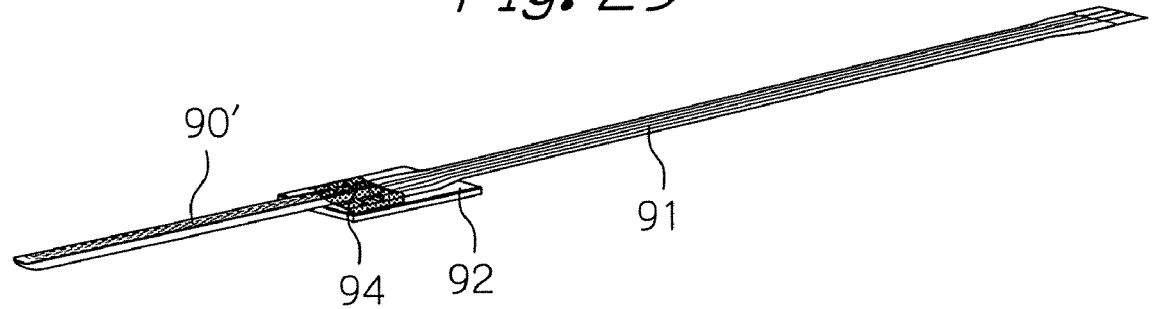
FIG. 29 is a view illustrating a part of the manufacturing process of the magnetic sensor shown in FIG. 1.

Then, as shown in FIG. 29, the connected portion by wire-bonding is covered with protection adhesive 94.

Thereafter, as shown in FIG. 1, the base portion of the needle-shaped detecting part 90' (10) and the FPC member 91 (12) are tightly sealed and incorporated in the housing 11 to complete a magnetic sensor.

Figure 30:
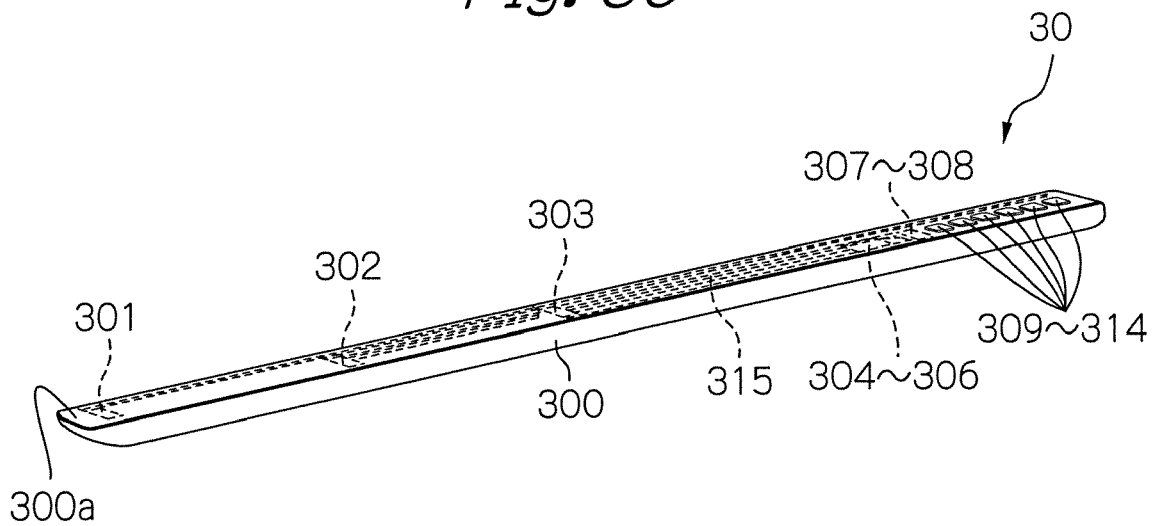
FIG. 30 is a perspective view schematically illustrating the structure of a needle-shaped detecting part of a magnetic sensor as another embodiment according to the present invention.
Figure 31:
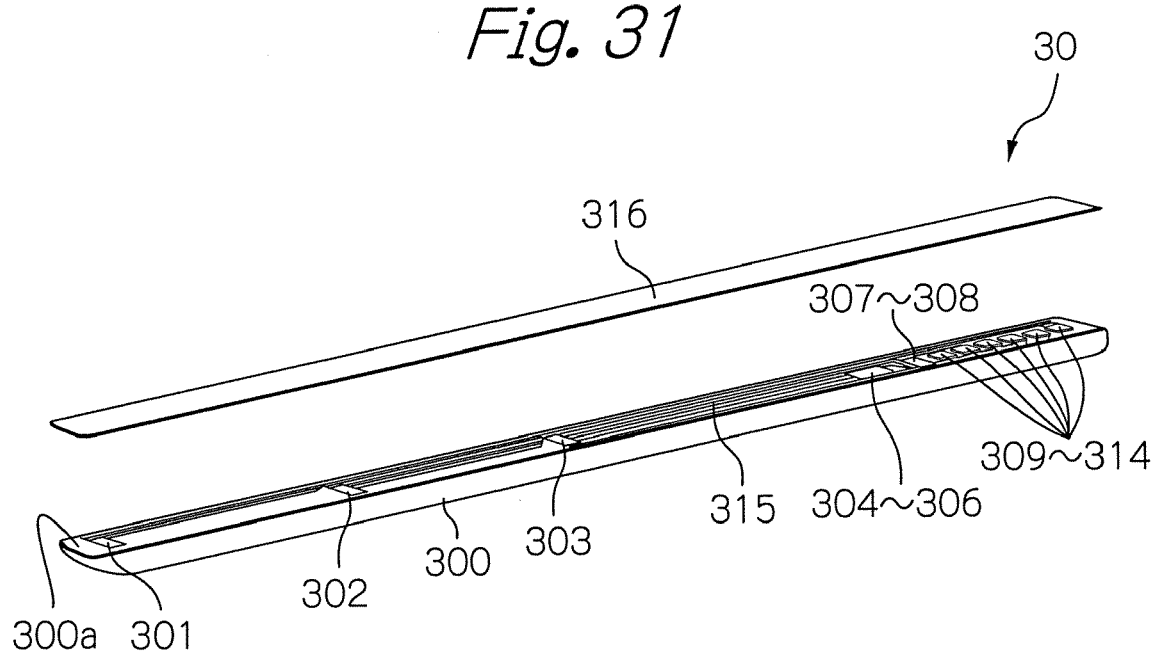
FIG. 31 is an exploded perspective view schematically illustrating the structure of the needle-shaped detecting part of the magnetic sensor shown in FIG. 30.
Figure 32:
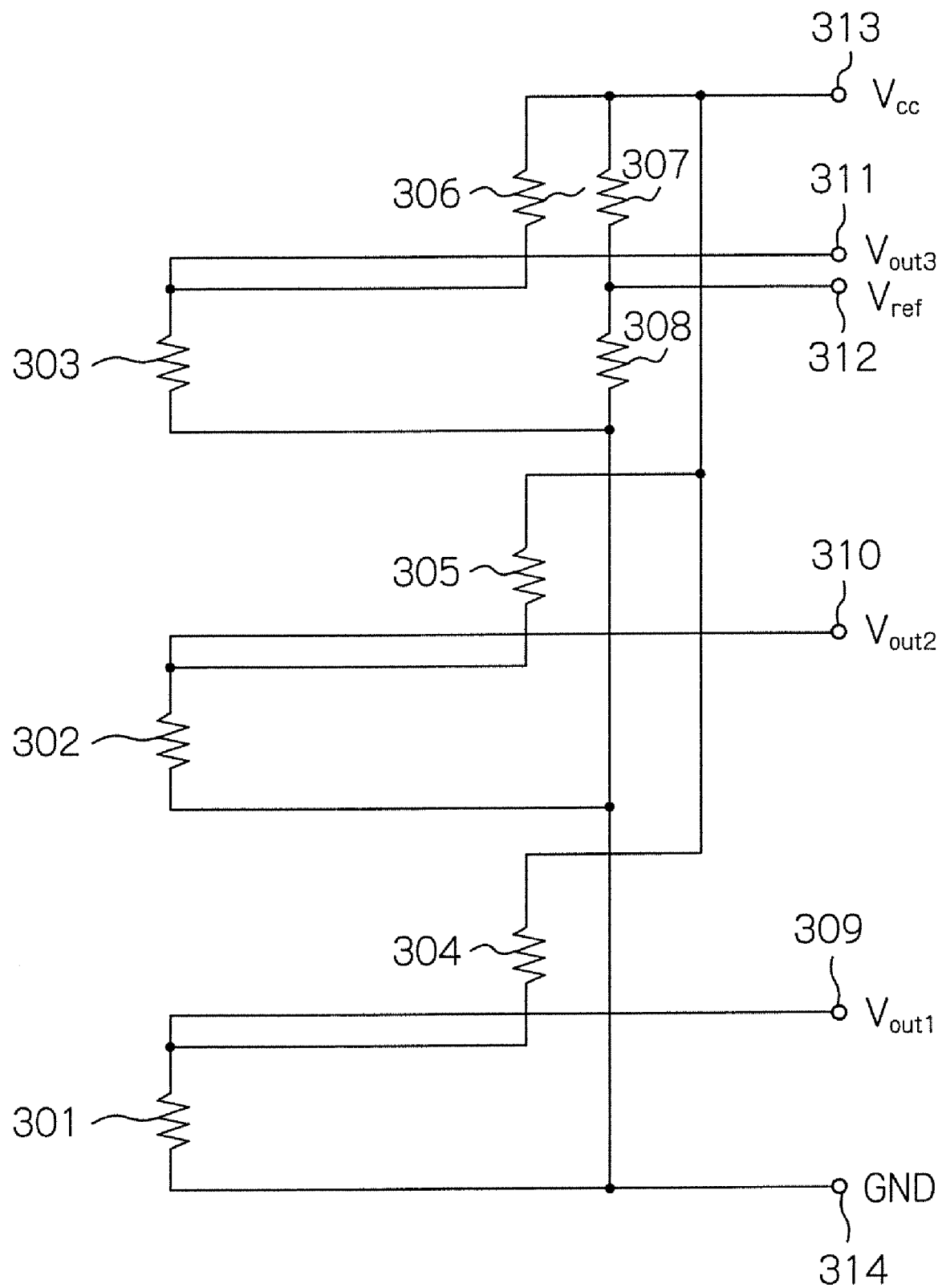
FIG. 32 is a circuit diagram illustrating the electric configuration of GMR elements, lead conductors and connection pads in the needle-shaped detecting part of the magnetic sensor shown in FIG. 30.

FIG. 30 schematically illustrates the structure of a needle-shaped detecting part of a magnetic sensor as another embodiment according to the present invention, FIG. 31 schematically illustrates in the exploded manner the structure of the needle-shaped detecting part in the magnetic sensor of FIG. 30, and FIG. 32 illustrates the electrical configuration of spin-valve GMR elements, lead conductors and connection pads in the needle-shaped detecting part in the magnetic sensor of FIG. 30. In this embodiment, the needle-shaped detecting part is configured as a multiple detection-element structure that includes three spin-valve GMR elements for measurement at the top portion, the middle portion and the rear end (base) portion of a substrate. The structure of an FPC member, connectors and housing in the embodiment is almost the same as those shown in FIG. 1 except the number of conductors of a wiring member and the number of connectors.

As shown in FIGS. 30 to 32, the needle-shaped detecting part 30 in this embodiment includes a needle shape substrate 300 with a sharp edge, formed by a cutting process, eight spin-valve GMR elements 301, 302, 303, 304, 305, 306, 307 and 308 formed of thin films on one surface (element-formed surface) 300a of the substrate 300, six connection pads 309, 310, 311, 312, 313 and 314, lead conductors 315 for electrically connecting the spin-valve GMR elements 301-308 to the connection pads 309-314, and a protection film 316 for covering the spin-valve GMR elements 301-308 and the lead conductors 315 except parts of the connection pads 309-314.

The substrate 300 is made of hard material, that is, metal material such as stainless steel, or ceramic material such as AlTiC.

Each of the spin-valve GMR elements 301-308 basically has a multi-layered structure formed by stacking a magnetization fixed layer consisting of a pin layer of anti-ferromagnetic material and a pinned layer of ferromagnetic material, a nonmagnetic space layer, and a free layer of ferromagnetic material. Magnetization of the pinned layer is fixed to a direction perpendicular to an extending direction of the free layer. All spin-valve GMR elements 301-308 have the same fixed magnetization direction. In this embodiment, similarly to the structure shown in FIG. 5, each spin-valve GMR element is configured from four strip-shaped spin-valve GMR multi-layered films arranged in parallel with each other and connected in series by means of lead conductors. In a modification, a folded-back pattern with one strip of spin-valve GMR multi-layered films may be used.

The connection pads 309-314 and the lead conductors 315 are formed of conductive material such as Cu. At portions of the connection pads 309-314, a bonding pad layer of Au is laminated on a bump layer of Cu.

The protection film 316 is configured by a single ceramic layer, such as an $Al_2O_3$ layer, in this embodiment. The whole surface of the needle-shaped detecting part 30, except the portions of the connection pads 309-314, is coved with a surface modifying layer, such as a DLC layer, a TiN layer or a $TiO_2$ layer. When the DLC layer is used as the surface modifying layer, it is beneficial to measurement, inspection or the like in a medical field because DLC has high biocompatibility. Since the TiN layer is a hard layer, it can harden the surface. The $TiO_2$ layer can have a function of resolving dirty things with the photo-catalyst reaction.

The connection pads 309, 310 and 311 are provided for output voltages Vout1, Vout2 and Vout3, respectively, the pad 312 is for a reference voltage Vref, the pad 313 is for a power supply voltage Vcc, and the pad 314 is for a ground GND.

The lead conductors 315 electrically connect these connection pads to the spin-valve GMR elements. As will be understood from FIG. 32, the four spin-valve GMR elements 301, 304, 307 and 308 constitute a Wheatstone bridge connection. The GMR element 301 operates as an element for magnetic detection (for measurement), and the other GMR elements 304, 307 and 308 operate as elements for temperature compensation. The four spin-valve GMR elements 302, 305, 307 and 308 also constitute a Wheatstone bridge connection. The GMR element 302 operates as an element for magnetic detection (for measurement), and the other GMR elements 305, 307 and 308 operate as elements for temperature compensation. Similarly, the four spin-valve GMR elements 303, 306, 307 and 308 also constitute a Wheatstone bridge connection. The GMR element 303 operates as an element for magnetic detection (for measurement), and the other GMR elements 306, 307 and 308 operate as elements for temperature compensation.

In this embodiment, the top end portion of the substrate 300 is cut off slantwise at the side opposite to the element-formed surface 300a, that is, a sharpening process is applied to have a sharp edge with a slope surface. The top portion of the substrate 300 has an inclination angle of 10-45 degrees to a longitudinal direction.

The spin-valve GMR element 301 for measurement is formed at the top portion of the substrate 300, and the GMR elements 304, 307 and 308 for temperature compensation at the base portion of the substrate 300. The spin-valve GMR element 302 for measurement is formed at the middle portion of the substrate 300, and the GMR elements 305, 307 and 308 for temperature compensation at the base portion of the substrate 300. Further, the spin-valve GMR element 303 for measurement is formed at the middle portion of the substrate 300, and the GMR elements 306, 307 and 308 for temperature compensation at the base portion of the substrate 300.

The magnetic sensor of this embodiment is configured as a multiple detection-element structure, and therefore it is possible to detect the density of magnetic particles in a wider area. With the exception of this advantage, the magnetic sensor of this embodiment has the similar advantages as in the magnetic sensor shown in FIG. 1. The similar modifications may be adopted in this embodiment as that in the embodiment of FIG. 1.

As for the multiple detection-element structure, three spin-valve GMR elements for measurement are formed at the top, and middle portions of the substrate 300 in the embodiment, but in modifications, two spin-valve GMR elements for measurement may be provided at the top and middle portions of the substrate 300, or four or more spin-valve GMR elements for measurement may be provided on the substrate.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A magnetic sensor having a needle-shaped detecting part, said needle-shaped detecting part comprising:
   a substrate cut to have a needle shape;
   at least one magnetoresistive effect element formed integrally on said substrate;
   at least two lead conductors formed integrally on said substrate, one ends of said lead conductors being electrically connected to said at least one magnetoresistive effect element; and
   a protection film covering said at least one magnetoresistive effect element and said at least two lead conductors.

2. The magnetic sensor as claimed in claim 1, wherein said at least one magnetoresistive effect element comprises at least one magnetoresistive effect element formed at a top portion of said substrate.

3. The magnetic sensor as claimed in claim 2, wherein said at least one magnetoresistive effect element further comprises at least one magnetoresistive effect element formed at a base portion of said substrate.

4. The magnetic sensor as claimed in claim 3, wherein said at least one magnetoresistive effect element further comprises at least one magnetoresistive effect element formed at a middle portion of said substrate.

5. The magnetic sensor as claimed in claim 3, wherein said at least one magnetoresistive effect element comprises one magnetoresistive effect element for measurement formed at the top portion of said substrate, and three magnetoresistive effect elements formed at the base portion of said substrate.

6. The magnetic sensor as claimed in claim 5, wherein said four magnetoresistive effect elements constitute a bridge connection.

7. The magnetic sensor as claimed in claim 4, wherein said at least one magnetoresistive effect element comprises one magnetoresistive effect element for measurement formed at the top portion of said substrate, at least one magnetoresistive effect element for measurement formed at the middle portion of said substrate, and at least four magnetoresistive effect elements formed at the base portion of said substrate.

8. The magnetic sensor as claimed in claim 7, wherein said one magnetoresistive effect element for measurement formed at the top portion of said substrate and three of said at least four magnetoresistive effect elements formed at the base portion of said substrate constitute a bridge connection, and wherein one of said at least one magnetoresistive effect element for measurement formed at the middle portion of said substrate and three of said at least four magnetoresistive effect elements formed at the base portion of said substrate constitute a bridge connection.

9. The magnetic sensor as claimed in claim 1, wherein said at least one magnetoresistive effect element comprises a plurality of magnetoresistive effect elements having the same fixed magnetization direction.

10. The magnetic sensor as claimed in claim 1, wherein said substrate is made of metal material or ceramic material.

11. The magnetic sensor as claimed in claim 1, wherein a top end of said substrate has a sharp edge with a slope surface.

12. The magnetic sensor as claimed in claim 11, wherein the slope surface of said sharp edge of said substrate is inclined at angles of 10-45 degrees to a longitudinal direction of said substrate.

13. The magnetic sensor as claimed in claim 1, wherein said protection film is a ceramic layer.

14. The magnetic sensor as claimed in claim 1, wherein said magnetic sensor further comprises a surface modifying layer covering almost whole surface of said needle-shaped detecting part.

15. The magnetic sensor as claimed in claim 14, wherein said surface modifying layer is a diamond-like carbon layer, a titanium nitride layer or a titanium oxide layer.

16. The magnetic sensor as claimed in claim 1, wherein said magnetic sensor further comprises at least two connection pads formed on said substrate and electrically connected, respectively, to the other ends of said at least two lead conductors.

17. The magnetic sensor as claimed in claim 16, wherein said magnetic sensor further comprises a flexible wiring member, one end of said flexible wiring member being electrically connected to said at least two connection pads.

18. The magnetic sensor as claimed in claim 17, wherein said flexible wiring member is a flexible printed circuit member.

19. The magnetic sensor as claimed in claim 17, wherein said magnetic sensor further comprises a housing for tightly sealing and incorporating said base portion of said needle-shaped detecting part and said flexible wiring member.

20. The magnetic sensor as claimed in claim 19, wherein said housing is made of resin material.

* * * * *